United States Patent [19]

Suzuki et al.

[11] 4,233,672
[45] Nov. 11, 1980

[54] HIGH-SPEED SEMICONDUCTOR DEVICE

[75] Inventors: Yasoji Suzuki, Ayase; Kiyofumi Ochii, Inagi; Hirozi Asahi, Zama, all of Japan

[73] Assignee: Tokyo Shibaura Denki Kabushiki Kaisha, Tokyo, Japan

[21] Appl. No.: 962,222

[22] Filed: Nov. 20, 1978

[30] Foreign Application Priority Data

Nov. 21, 1977 [JP] Japan ................. 52-139586

[51] Int. Cl.² .............................................. G11C 7/00
[52] U.S. Cl. ............................ 365/181; 307/DIG. 1; 357/42; 365/226
[58] Field of Search ................. 357/42; 307/304, 313, 307/DIG. 1; 365/181, 189, 226

[56] References Cited

U.S. PATENT DOCUMENTS 3,916,430  10/1975  Heuner et al. ...................... 357/42

OTHER PUBLICATIONS

Oliphant, Application Engineering, Designing Non-Volatile Memory Systems with Intels 5101 RAM, 1975.

Primary Examiner—Stuart N. Hecker
Attorney, Agent, or Firm—Finnegan, Henderson, Farabow, Garrett & Dunner

[57] ABSTRACT

A CMOS semiconductor memory device in which a memory cell array and peripheral circuits are formed on the same semiconductor substrate. Wells of the peripheral circuits with MOS transistors of one channel type formed therein are supplied with a PN junction reverse bias potential higher than that for wells of the memory cell array during the memory operation, while the potential at the peripheral circuit wells is made equal to the potential at the wells of the memory cell array when the memory is not operating. High-speed operation of the memory device may be achieved because the junction capacitance of the MOS transistors formed in the peripheral circuit wells is reduced when the memory is operating.

3 Claims, 8 Drawing Figures

SENSE AMPLIFIER 16

HIGH-SPEED SEMICONDUCTOR DEVICE

BACKGROUND OF THE INVENTION

This invention relates to a semiconductor device and, more particularly to a semiconductor device calling for of high-speed operation.

Recently, semiconductor integrated memory devices with MOS transistors have remarkably developed. As objectives to be attained in the future, there are large-scale integration and speed-up in operation. Speed-up in operation of the MOS memory may be realized by reducing data readout time tACC. As is generally known, the operating speed of a MOS integrated circuit may substantially be affected by charge and discharge times of capacitances parasitic on the circuit. Therefore, reduction in the stray capacitance of the circuit will lead to an increase in the operating speed.

In the case of the MOS integrated circuit, the stray capacitances may generally include a gate capacitance provided by an insulating film under a gate electrode and a diffusion capacitance or junction capacitance by a PN junction which is reverse-biased. It is well known that the diffusion capacitance is in inverse proportion to the square root of the reverse bias voltage of the PN junction. Accordingly, the diffusion capacitance may be reduced by increasing the reverse bias voltage applied to the substrates of the MOS transistors or wells.

In a CMOS memory device, each memory cell stores data statically when the memory is quiescent (when the memory device is not used). At time of operation, the peripheral circuits operate to read out data from an accessed memory cell. Therefore, it is effective to increase the operating speed of the peripheral circuits for reduction of the data readout time tACC. That is, it is desired that the junction capacitance at the peripheral circuits be reduced.

In the MOS integrated circuit, there are generally used two operating potentials $V_{DD}$ (e.g., +5 V) and $V_{SS}$ (GND). It is possible externally to supply a reverse bias potential capable of reducing the capacitance of the PN junctions in the peripheral circuits, which may not, however, be advantageous to the integrated circuit. Thus, the reverse bias potential to reduce the junction capacity should preferably be produced inside the integrated circuit.

Moreover, according to an approach to shorten the operating time by reducing only the junction capacitance of the peripheral circuits instead of uniformly reducing the junction capacitances of the memory cell array and the peripheral circuits, the reverse bias potential to reduce the junction capacitance of the peripheral circuits may be supplied only at time of operation. In applying the capacitance-reducing reverse bias potential to the memory cell array at operation, the substrate potential of MOS transistors in a memory cell varies from an operating time to a non-operating time, varying the threshold voltage of the MOS transistors and causing stored data to be lost.

In a CMOS integrated circuit, MOS transistors of one channel type are formed in wells of one conductivity type with an impurity concentration higher than that of a semiconductor substrate of the other conductivity type, while MOS transistors of the other channel type are formed in the substrate. Accordingly, the junction capacitance of the MOS transistors formed in the wells is larger than that of the MOS transistors formed in the semiconductor substrate, so that reduction in capacitance of the MOS transistors in the wells will contribute to the speed-up in operation.

SUMMARY OF THE INVENTION

The object of this invention is to provide a semiconductor conductor device, such as a memory device, capable of operating at a high speed.

In the semiconductor memory device, a memory cell array and peripheral circuits are formed on a semiconductor substrate, and a number of wells having PN junctions therein are formed in the case of a CMOS device. The impurity concentration of the wells is higher than that of the semiconductor substrate, so that the junction capacitance of the wells is larger than that of the substrate. According to this invention, the wells of the peripheral circuits are supplied with a higher PN junction reverse bias potential as compared with the wells of the memory cell array, in order to reduce the junction capacitance in the wells of the peripheral circuit section that contributes largely to high-speed operation, thereby facilitating the high-speed operation.

DETAILED DESCRIPTION OF THE PREFERRED EMBODIMENT

Figure 1:
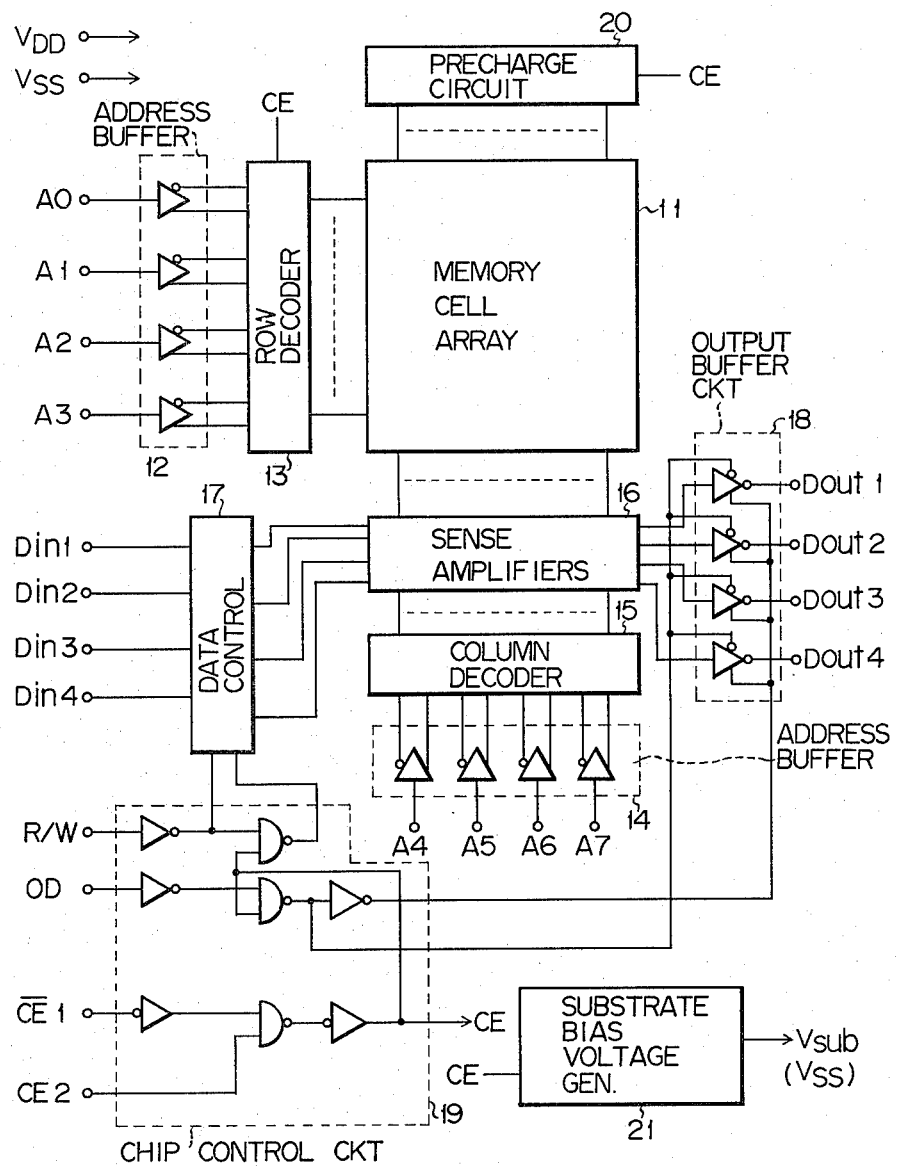
FIG. 1 shows the configuration of a memory device according to this invention formed on a semiconductor substrate.

FIG. 1 shows a configuration of a CMOS memory formed on a semiconductor chip. As is generally known, this semiconductor memory consists of a memory cell array 11, address buffer 12, row decoder 13, address buffer 14, column decoder 15, sense amplifier 16, data control circuit 17, output buffer circuit 18, chip control circuit 19, and a percharge circuit 20. In FIG. 1, there are shown address signals A0 to A7, input data Din1 to Din4, output data Dout1 to Dout4, read/write control signal R/W, output disable signal 0D, external chip enable signals $\overline{CE1}$ and CE2, and an internal chip enable signal CE. $V_{DD}$ (+5 V) and $V_{SS}$ (GND) are operating potentials.

Reference numeral 21 denotes a bias voltage generator formed on the same semiconductor substrate for the aforesaid circuits, the output of which is coupled to wells forming therein MOS transistors of a first channel type among complementary MOS transistors which compose a peripheral circuit section including the address buffer circuits 12 and 14, row and column decoders 13 and 15, sense amplifier 16, data control circuit 17, output buffer circuit 18, and the chip control circuit 19, producing a negative reverse bias potential Vsub from $V_{VV}$ at the wells in response to the HIGH-level chip enable signal CE representing memory chip selection so as to reduce the junction capacitance, and bringing down the wells to the $V_{SS}$ level (ground level) when the chip enable signal is at LOW level, that is, in the non-operating state. Irrespective of operation or inoperation of the memory chip, $V_{SS}$ is coupled to the wells forming the first-channel-type MOS transistors out of the complementary MOS transistors composing the memory cells. Therefore, the threshold voltage of the MOS transistors of memory cells is kept constant, enabling maintenance of stored data at the inoperative time of memory chip.

Figure 2:
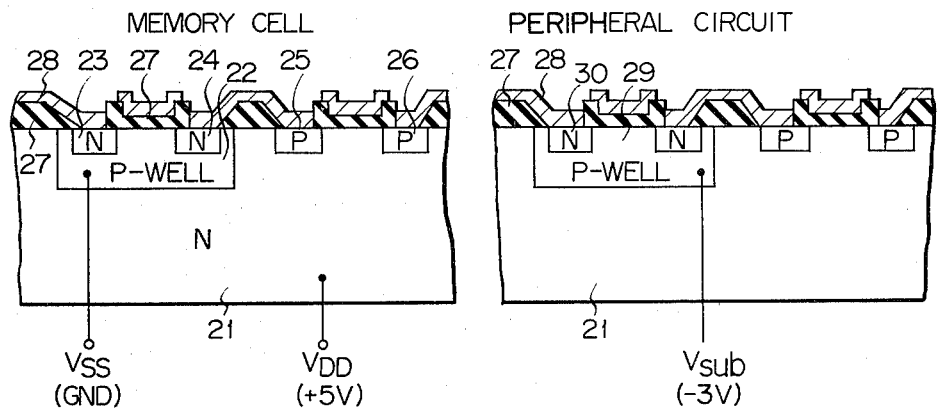
FIG. 2 shows sectional view of the semiconductor substrate at memory cell and peripheral circuit sections according to the invention.

FIG. 2 shows sections of part of the memory cell array 11 and part of the peripheral circuit. In a semiconductor substrate 21 of N-type, for example, is formed a P-well 22, in which N-type source and drain regions 23 and 24 are formed to constitute an N-channel MOS transistor. The P-well 22 serves as a substrate of the N-channel transistor. P-type source and drain regions 25 and 26 are formed in the semiconductor substrate 21 to constitute a P-channel MOS transistor. Numerals 27 and 28 designate an insulating layer such as silicon dioxide and a conductive layer respectively. The semiconductor substrate 21 is supplied with the operating potential $V_{DD}$ (e.g., +5 V), while the P-well 22 is given the operating potential $V_{SS}$ (ground level). The arrangement shown in the left-hand portion of FIG. 2 is a CMOS basic inverter forming part of a memory cell. The P-wells 22 of the memory cell are always impressed with the ground potential $V_{SS}$ in order to secure the stored data at selection and nonselection of the memory chip.

The right-hand portion of FIG. 2 shows a CMOS basic inverter as an example of the CMOS circuit used in the circuit section other than the memory cell array. The reverse bias potential Vsub (e.g., −3 V) is applied to a P-well 29 in which N-type source and drain regions 30 and 31 are formed to form an N-channel MOS transistor. In the P-well 29 are PN junctions formed between the source region 30 and the P-well 29 and between the drain region 31 and the P-well 29, these PN junctions being biased in the reverse direction by the bias voltage Vsub of the bias voltage generator circuit. Also in the P-well 22 are PN junctions formed between the drain region 24 and the P-well 22 and between the source region 23 and the P-well 22, these PN junctions being biased in the reverse direction by the ground potential ($V_{SS}$). However, the reverse bias voltage of the PN junction in the P-well 29 is higher than that of the PN junctions in the P-well 22, so that the P-well 29 is smaller than the P-well 22 in junction capacitance. Accordingly, in the peripheral circuits, the operating speed becomes higher when Vsub is applied to the P-wells 29 than when the ground potential is applied. Since the impurity concentration of the P-well 29 is about ten times higher than that of the substrate 21, the N-channel MOS transistor formed in the P-well 29 is larger than the P-channel MOS transistor formed in the substrate in junction capacitance. Therefore, it is to be desired that the junction capacitance in the P-well regions should be reduced for the high-speed operation.

Figure 3:
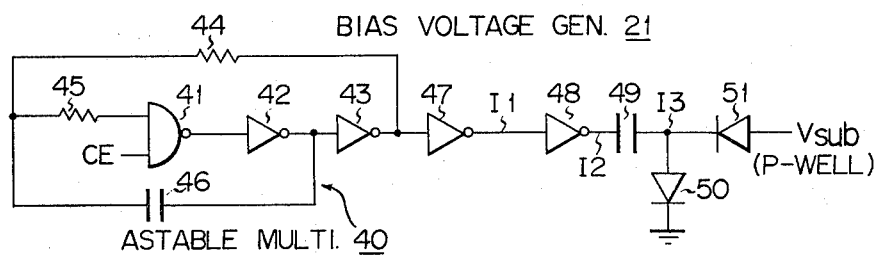
FIG. 3 shows an example of a bias generator.

FIG. 3 shows an example of the bias voltage generator 21, in which an astable multivibrator 40 consists of a NAND gate 41, inverters 42 and 43, resistors 44 and 45, and capacitor 46. Since the chip enable signal CE is coupled to the NAND gate 41, the astable multivibrator 40 is enabled only when CE is at HIGH-level, thereby producing a square-wave output pulse.

Output I1 of an inverter 47 is connected through an inverter 48 to one end of a capacitor 49 with the other end of the capacitor 49 connected to the anode of a diode 50 with its cathode connected to ground, and to the cathode of a diode 51 with its anode connected to the P-wells 29 of the peripheral circuit section.

Figure 4:
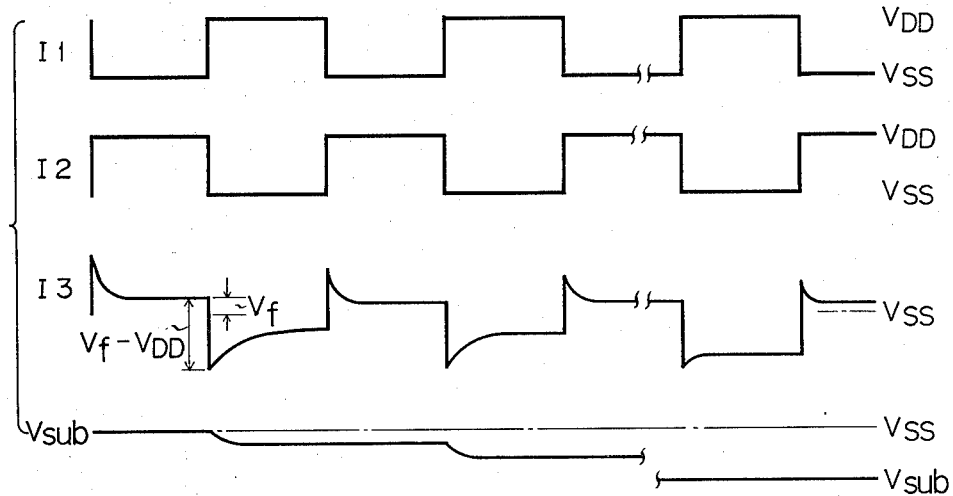
FIG. 4 is a waveform diagram for illustrating the operation of the bias generator of FIG. 3.

Referring now to the waveform of FIG. 4, there will be described operation of the bias generator of FIG. 3. In FIG. 3, I1 and I2 shows output waveforms of the astable multivibrator 40 and the inverter 48 respectively. As illustrated, I1 and I2 are opposite to each other in phase. I3 shows an output waveform of a differentiation circuit composed of the capacitor 49 and diode 50.

At the moment the input voltage I2 of the differentiation circuit instantaneously rises up to the $V_{DD}$ level, and then gradually drops to the cut-in voltage level Vf of the diode 50 since the diode 50 is allowed to conduct while I2 is at HIGH level. Thereafter, when I2 is reduced to LOW level, I3 instantaneously falls down to Vf−$V_{DD}$ level. Consequently, the diode 51 is caused to conduct, and positive electric charges at the P-wells are absorbed by the capacitor 49. Thus, the potential Vsub at the P-wells becomes negative with respect to ground. In this process, the potential of I3 increases gradually. When such operation is repeated, the positive charges at the P-wells continue to be absorbed by the capacitor 49, and the potential at the P-wells further drops in the negative range as shown in FIG. 4. The potential Vsub is stabilized where the absorption rate of the positive charges from the P-wells by the bias generator balances the inflow rate of the positive charges from the PN junctions (between the P-well and substrate, between the P-well and source region and between the P-well and drain region) to the P-wells.

Figure 5:
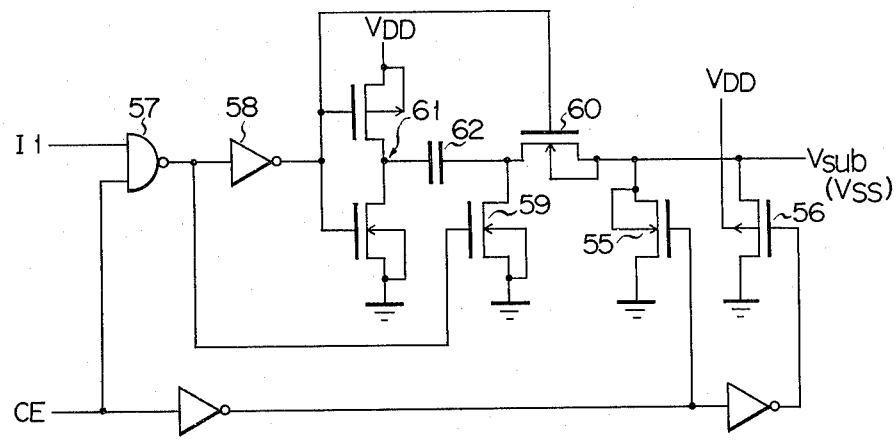
FIG. 5 shows a modification of part of the bias generator of FIG. 3.

FIG. 5 shows a modifications of the output section connected to the output of the astable multivibrator 40 of the bias generator of FIG. 3. Using MOS transistors in place of diodes, this modification is suited for integrated circuits. In integrated circuits a MOS transistor requires narrower space as compared with a diode.

When the chip enable signal CE is at LOW level ($V_{SS}$), that is, when the memory chip is not selected, an N-channel MOS transistor 55 and a P-channel MOS transistor 56 are both on, and the output Vsub is at the ground potential ($V_{SS}$). When the chip enable signal CE is at HIGH level ($V_{DD}$), the MOS transistors 55 and 56 are both off, and a NAND gate 57 is enabled. As mentioned before, the astable multivibrator 40 produces the square-wave output I1 with CE at HIGH level, so that the square-wave output is obtained from the output of the NAND gate 57. The output of the NAND gate 57 is coupled to the input of an inverter 58. An N-channel MOS transistor 59 with its gate coupled to the output of the NAND gate 57 and an N-channel MOS transistor 60 with its gate coupled to the output of the inverter 58 are enabled and disabled alternately. An inverter 61 and a capacitor 62 are connected in series between the inverter 58 and transistor 60. Since the circuit of FIG. 5 differs from the circuit of FIG. 3 only in that the MOS transistors 59 and 60 are substituted for the diodes 50 and 51, the former operates in the same manner with the latter. The inverter 61, which tends to increase the driving power for the capacitor 62, may be provided as required.

Figure 6:
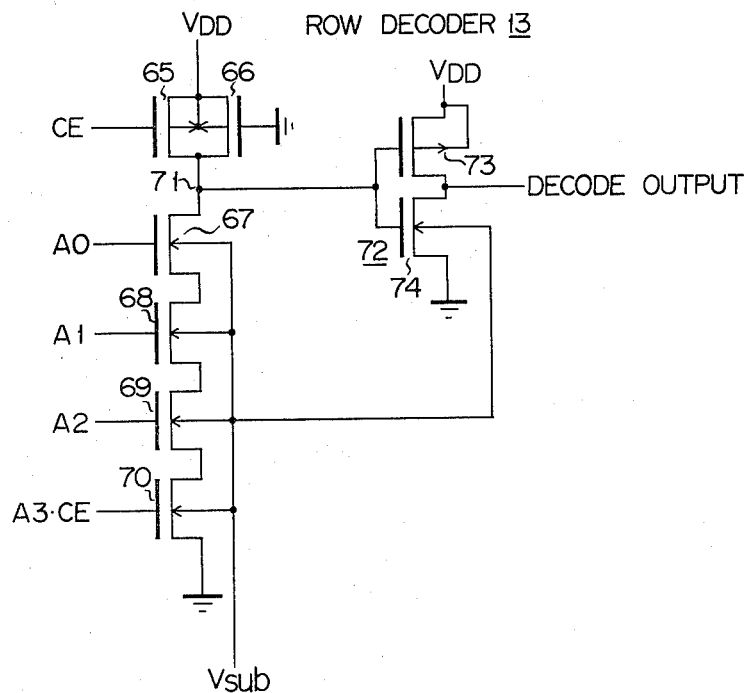
FIG. 6 shows part of a row decoder shown in FIG. 1.

FIG. 6 shows part of the row decoder 13, one of the peripheral circuits. In this example, a parallel connection of P-channel control transistor 65 and a P-channel load transistor 66, and a series connection of N-channel decode transistors 67 to 70 are connected in series between the power sources $V_{DD}$ and $V_{SS}$. A node 71 between the P-channel transistor parallel connection and the N-channel transistor series connection is coupled to the input of an inverter 72 consisting of P-channel and N-channel transistors 73 and 74. The output of the inverter 72 is adapted to control gate transistors connected to the memory cell mentioned later. In the configuration of FIG. 6, the transistor 65 is on and the transistor 70 is off when the chip enable signal CE is at LOW level. Therefore, the potential at the node 71 is at HIGH level, so that the decode output is at LOW level. When the chip enable signal CE and the address signals A0 to A3 are both at HIGH level, the transistor 65 is off and the transistors 67 to 70 are on. The gate of the load transistor 66 is connected to ground, so that the transistor 66 is always on. Since the sum total of the on-resistance of the N-channel transistors 67 to 70 is set smaller than the on-resistance of the transistor 66, however, the potential at the node 71 drops to a level that enables the transistor 73 of the inverter 72 to conduct. Accordingly, the decode output attains HIGH level.

In the configuration of FIG. 6, the n-channel transistors 67 and 70 are formed in the P-wells of the semiconductor substrate. Since the potential at the substrate of the N-channel transistor or the P-well is brought down to the Vsub level lower than the ground potential during the operation of the memory chip, the junction capacitance of the N-channel transistor is reduced, increasing the decoder operating speed.

Figure 7:
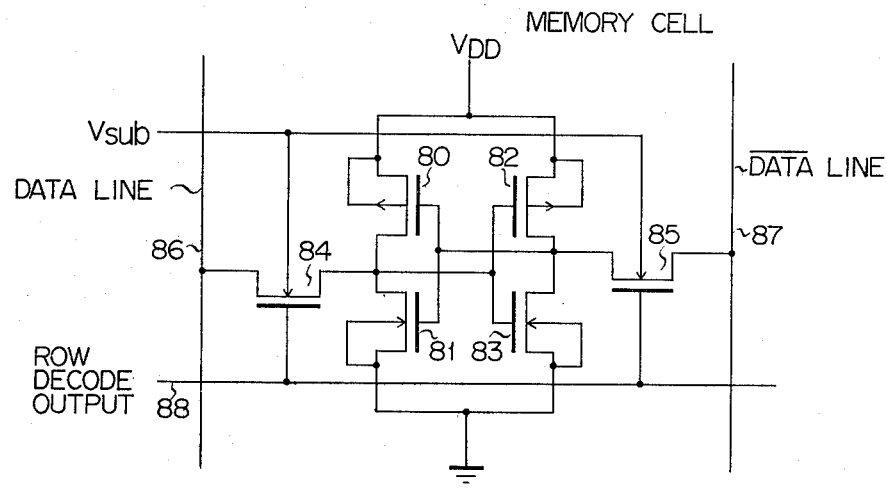
FIG. 7 shows part of a memory cell array shown in FIG. 1.

FIG. 7 shows the configuration of a well-known memory cell. This memory cell is formed of a flip-flop including P-channel transistors 80 and 82 and N-channel transistors 81 and 83. The substrates of the P-channel transistors 80 and 82 are connected to $+V_{DD}$, while the substrates or P-wells of the N-channel transistors 81 and 83 are connected to ground. The complementary outputs of the memory cells are connected, respectively, to DATA and $\overline{DATA}$ lines 86 and 87 via N-channel gate transistors 84 and 85. The gate electrodes of the transistors 84 and 85 are connected to a row decode output line 88. When the row decode output line attains HIGH level, the gate transistors 84 and 85 are turned on, with the result that data in the memory cell is read out to the DATA and $\overline{DATA}$ lines 86 and 87 or data is written in the memory cell through the DATA and $\overline{DATA}$ lines 86 and 87. At the memory cell, the substrate potential of the N-channel transistors 81 and 83 is maintained at the ground level, so that the data may be kept stable without regard to the operating or non-operating state of the memory chip. On the other hand, the substrate voltage of the N-channel gate transistors 84 and 85 is Vsub, so that it will be possible to increase the data reading or writing speed at selection of the memory cell.

Figure 8:
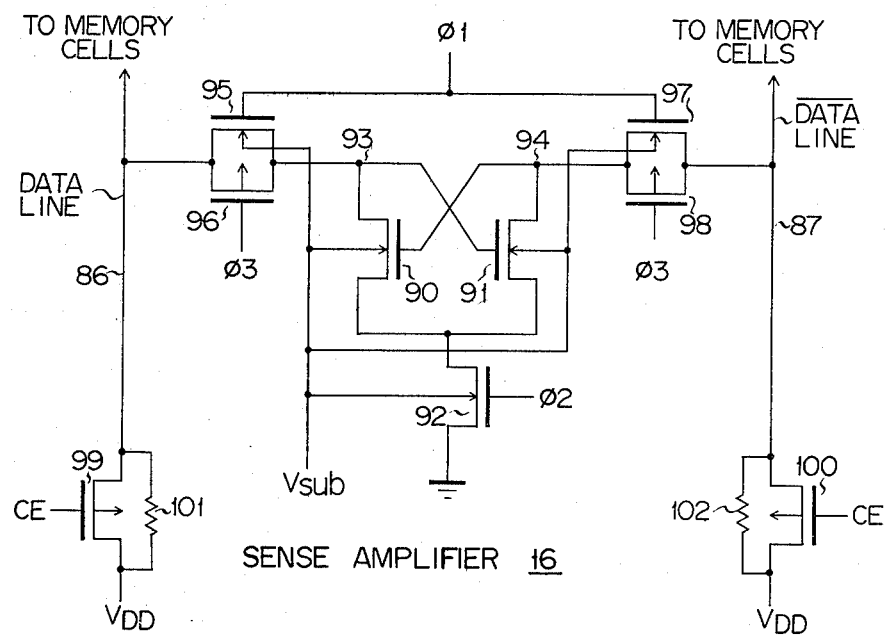
FIG. 8 shows part of a sense amplifier shown in FIG. 1.

FIG. 8 shows the configuration of the sense amplifier 16, which is comprised of n-channel transistors 90 and 91 connected in the configuration of the flip-flop, and an N-channel switch transistor 92 to connect the source electrodes of the transistors 90 and 91 to ground. An output 93 of the flip-flop is connected to the DATA line 86 through a parallel connection of N-channel and P-channel gate transistors 95 and 96, while a complementary output 94 is connected to the $\overline{DATA}$ line 87 via a parallel connection of P-channel and N-channel gate transistors 97 and 98. The DATA and $\overline{DATA}$ lines 86 and 87 are connected to $V_{DD}$ through P-channel precharge transistors 99 and 100 respectively, as well as memory cells belonging to the same column. Pull-up resistors 101 and 102 of a fairly large resistance may be connected in parallel with the precharge transistors 99 and 100 respectively.

In this sense amplifier, the transistors 99 and 100 are turned on by the chip enable signal CE at HIGH level ($V_{DD}$) to precharge stray capacitances (not shown) of the DATA and $\overline{DATA}$ lines 86 and 87 to $V_{DD}$. At the same time, stray capacitances (not shown) at the outputs 93 and 94 of the flip-flop are precharged to $V_{DD}$ through the gate transistors 96 and 98 whose gate electrodes are supplied with a timing signal $\phi_3$ at LOW level ($V_{SS}$). At this time, a timing signal $\phi_2$ is at LOW level and the transistor 92 is off. The timing signal $\phi_1$ applied to the gate electrodes of the transistors 95 and 97 is at HIGH level during a read cycle.

When data is read out from one of the memory cells connected to the DATA and $\overline{DATA}$ lines 86 and 87, the potential of one of the data lines 86 and 87 drops in accordance with the readout data. If the potential of the $\overline{DATA}$ line 87 drops, for example, the capacitor of the flip-flop output 94 is discharged through the transistor 98. Thereafter, the timing signal $\phi_3$ becomes HIGH level ($V_{DD}$) to turn off the transistors 96 and 98. Then, the timing signal $\phi_2$ becomes HIGH level ($V_{DD}$) to turn the transistor 92 on. In consequence, the capacitor of the flip-flop output 94 is discharged to LOW level ($V_{SS}$) through the transistors 91 and 92, whereby the source potential of the transistor 97 drops and the transistor 97 is turned on. As a result, the $\overline{DATA}$ line 87 is rapidly brought down to the $V_{SS}$ level through the transistors 97, 91 and 92. Since the flip-flop output 93 is maintained substantially at the $V_{DD}$ level, the transistor 95 is off. Accordingly, the potential of the DATA line 86 stays at $V_{DD}$. Since the DATA line 86 is maintained at $V_{DD}$ and the $\overline{DATA}$ line 87 is reduced to $V_{SS}$ by the operation of the sense amplifier, the accessed memory cell can be refreshed. The DATA and $\overline{DATA}$ lines 86 and 87 are coupled to a suitable output buffer circuit to deliver the readout data to a data utilizing circuit.

Although the above-mentioned sense amplifier is so constructed as to reduce the data readout time, the operating speed may be increased since the substrate potential of the N-channel transistors 90, 91, 92, 95 and 97 is maintained at Vsub in operation. Thus, the data readout time any further be reduced.

Although this invention has been described herein with regard to the case where the N-type silicon substrate is used, a P-type silicon substrate may also be used. In this case, Vsub is coupled to N-wells formed in the substrate.

What we claim is:

1. A semiconductor device operated with first, second, and third operating potentials, said semiconductor device comprising:
   a semiconductor substrate of a first conductivity type supplied with said first operating potential;
   a first well of a second conductivity type formed in said substrate and having a source region and a drain region, both of said first conductivity type, formed therein to form capacitive PN junctions therewith, said first well and said source region formed in said first well being supplied with said second operating potential; and
   a second well of said second conductivity type formed in said substrate and having a source region and a drain region, both of said first conductivity type, formed therein of form capacitive PN junctions therewith, said source region formed in said second well being supplied with said second operating potential and said second well being supplied with said third operating potential to make the capacitances of said PN junctions formed in said second well smaller than the capacitances of said PN junctions formed in said first well.

2. A semiconductor memory device comprising:
a semiconductor substrate of a first conductivity type;
a memory cell array formed on said semiconductor substrate, each memory cell being formed of complementary MOS transistors, said memory cell array having first wells of a second conductivity type formed in said semiconductor substrate which have PN junctions formed therein to constitute MOS transistors of one channel type;
peripheral circuits for selecting one memory cell of said memory cell array and reading out data from the selected memory cell, each said peripheral circuit consisting of complementary MOS transistors and having second wells of said second conductivity type formed in said semiconductor substrate which have PN junctions formed therein to constitute MOS transistors of said one channel type; and
means for supplying first, second and third operating potentials, respectively, to said semiconductor substrate, first wells, and second wells, said second and third operating potentials being so selected that a reverse bias voltage of said PN junctions in said second wells given by said third operating potential is higher than a reverse bias voltage of said PN junction in said first wells given by said second operating potential.

3. A semiconductor memory device comprising:
a semiconductor substrate of a first conductivity type, said semiconductor substrate being supplied with a first operating potential;
a memory cell array formed on said semiconductor substrate, each memory cell being formed of complementary MOS transistors, said memory cell array having first wells of a second conductivity type formed in said semiconductor substrate which have PN junctions formed therein to constitute MOS transistors of one channel type, said first wells being supplied with a second operating potential to reverse bias said PN junctions in said first wells;
peripheral circuits for selecing one memory cell of said memory cell array and reading out data from the selected memory cell, said peripheral circuits being constituted by complementary MOS transistors and having second wells of said second conductivity type formed in said semiconductor substrate which have PN junctions formed therein to constitute MOS transistors of said one channel type; and
means formed in said semiconductor substrate and responsive to presence or absence of a control signal representing memory cell selection, to couple said second operating potential to said second wells when said control signal is absent, and a third potential to said second wells when said control signal is present to provide a reverse bias voltage to said PN junctions in said second wells higher than a reverse bias voltage of said PN junctions given by said second operating potential.

* * * * *